United States Patent [19]
Bowers

[11] Patent Number: 5,387,912
[45] Date of Patent: Feb. 7, 1995

[54] DIGITAL-TO-ANALOG CONVERTER WITH REFERENCE GLITCH REDUCTION

[75] Inventor: Derek F. Bowers, Sunnyvale, Calif.

[73] Assignee: Analog Devices, Inc., Norwood, Mass.

[21] Appl. No.: 162,577

[22] Filed: Dec. 2, 1993

[51] Int. Cl.[6] .................................... H03M 1/06
[52] U.S. Cl. ........................... 341/118; 341/144
[58] Field of Search ............. 341/118, 136, 144, 154; 307/496, 456, 500, 576

[56] References Cited

U.S. PATENT DOCUMENTS 3,810,130  5/1974  Schneider .................... 365/181
5,184,129  2/1993  Fung et al. .................... 341/144

Primary Examiner—Brian K. Young
Attorney, Agent, or Firm—Koppel & Jacobs

[57] ABSTRACT

A analog-to-digital converter (DAC) comprises a plurality of circuit stages. Each of the circuit stages includes a switching circuit having an assertive circuit portion and a complementary circuit portion. A first transistor and a first resistor constitute the assertive circuit portion, which is electrically connected between a first reference voltage supply conductor and a switch output node inside the DAC. In a similar fashion, a second transistor and a second resistor constitute the complementary circuit portion, which is also electrically connected between a second reference voltage supply conductor and the switch—output node. The first and second resistors, and the resistor in the resistor network which is electrically connected to the switch output node, are substantially equal in ohmic values. Thus, when one of the circuit portions is active and the other circuit portion is inactive, the corresponding resistor in the active circuit portion operates as a part of the resistor network to provide a voltage division between the first and second reference voltage supply conductors. However, when both of the circuit portions are active, the first and second resistors operate together as a current limiting circuit to prevent an excess current surge between the first and second reference voltage supply conductors.

24 Claims, 7 Drawing Sheets

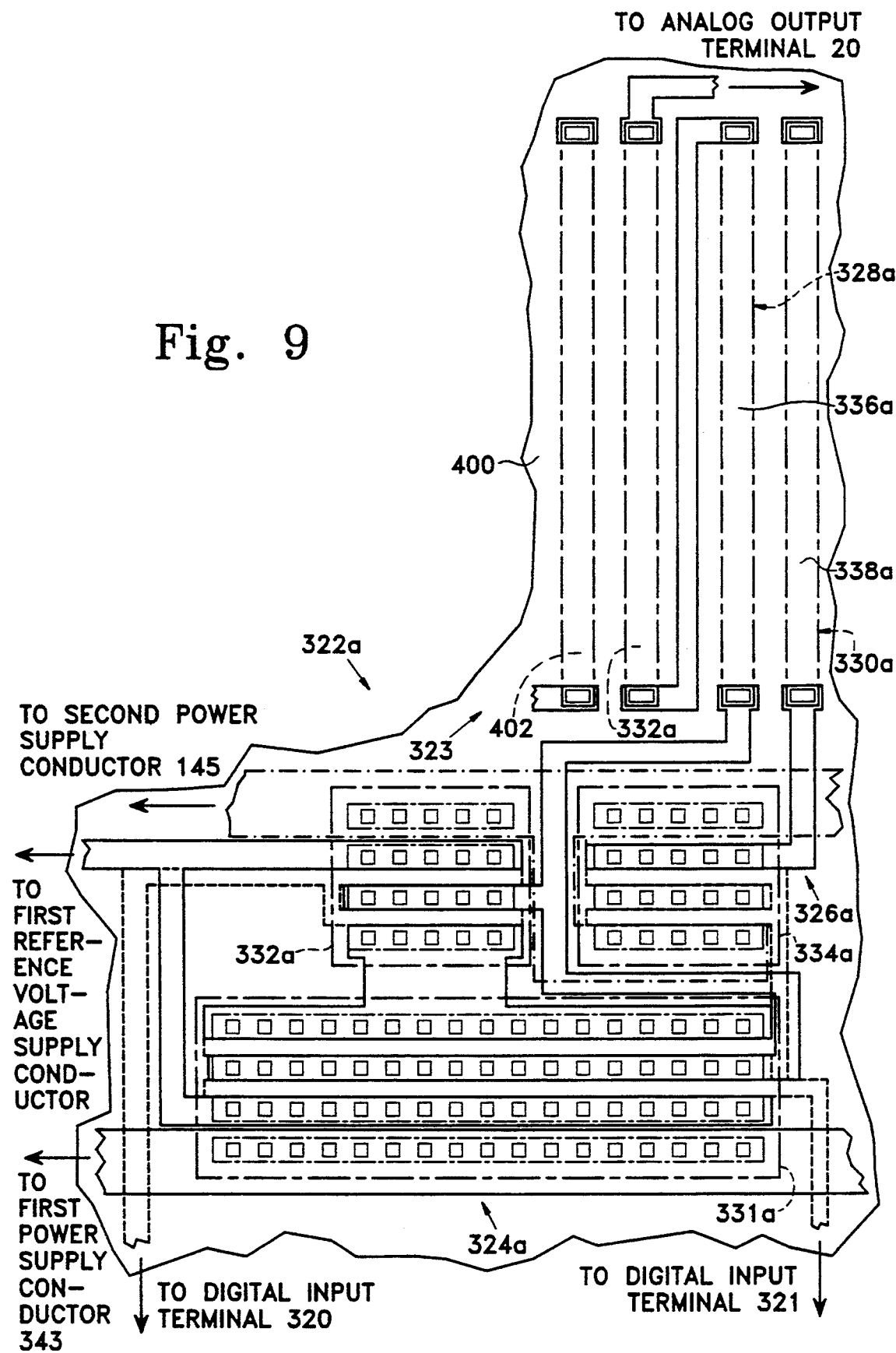

DIGITAL-TO-ANALOG CONVERTER WITH REFERENCE GLITCH REDUCTION

BACKGROUND OF THE INVENTION

1Field of the Invention

This invention is related to electronic circuits. In particular, this invention is related to electronic circuits capable of converting digital signals to analog signals.

2. Description of the Related Art

In modern day electronic systems, signals are often processed digitally while interfacing devices receive or transmit signals in an analog fashion. For example, in a video system of a computer, digital signals from the Central Processing Unit (CPU) are normally converted into analog signals before reaching the display monitor. In a robotics system, processed digital pulses are transformed into analog signals before feeding into a servo control mechanism. Digital-to-analog converters (DACs) are widely used for these purposes. As electronic circuits are built with faster and faster speed, DACs built with conventional design no longer can offer satisfactory performances. A few examples may serve as an illustration.

Reference is now made to FIG. 1 which shows a schematic diagram of a known DAC that employs an R-2R resistor network. The DAC, generally denoted by reference numeral 10, typically comprises an R-2R resistor network 12 connected to switches 14a to 14d. Resistor network 12 functions as a voltage divider for the reference supply voltages Vref1 and Vref2 applied at reference voltage terminals 16 and 18, respectively. The positions of the switches represent a digital input pattern which in turn proportionally divides the voltage difference between reference supply voltages Vref1 and Vref2. Each combination of switch positions corresponds to a specific stepped-voltage level Vout at the analog output terminal 20. Applying Kirchhoff's law to the DAC circuit 10, it can be shown that the relationship between the digital inputs, the positions of the switches 14a to 14d in this case, and the analog output at output terminal 20 can be expressed by the following equation:

$$V_{out} = \frac{[D_1 \times 2^0] + [D_2 \times 2^1] + [D_3 \times 2^2] + [D_4 \times 2^3]}{2^4} \times [V_{ref1} - V_{ref2}]$$

where

Vout is the stepped-analog output in volts;

Vref1 and Vref2 are reference supply voltages in volts; and $D_1$, $D_2$, $D_3$ and $D_4$ are digital input data with each assigned a numerical value of either 1 or 0.

In this example, DAC 10 is a four-bit circuit with the Most Significant Bit (MSB) being $D_4$ and the Least Significant Bit (LSB) being $D_1$. The four inputs yield sixteen digital input combinations ($2^4$), with each combination corresponding to a stepped analog voltage level. For example, a binary number 0110 when applied to the switches 14a–14d would generate a stepped-analog output of [0.375×(Vref1−Vref2)] volts at output terminal 20.

The described circuit has a problem in the design of switches 14a–14 d. FIG. 2 shows switches 14a–14 d of FIG. 1 implemented with Complementary Metal Oxide Semiconductor (CMOS) switches 15a–15d. Each of CMOS switches 15a–15d includes the corresponding digital input terminals 54 to 60, p-channel MOS transistors 62a to 62d, and n-channel CMOS transistors 64a to 64d. For example, when a high voltage value close to Vref1 is applied to digital terminal 60 of CMOS switch 15a, transistor 64a is rendered active while transistor 62a is inactive with a high channel impedance. The switch's output circuit node 70a is therefore electrically tied to reference voltage supply terminal 18, which is sitting at a voltage level of Vref2. If a low voltage with a value close to Vref2 is applied to digital input terminal 60, the scenario is reversed. This time, p-channel transistor 62a is conductive and n-channel transistor 64a is turned off. Circuit node 70a is basically electrically tied to reference supply voltage terminal 16, which is at a voltage level of Vref1.

A problem arises during the transitional period when the voltage level at terminal 60 switches from Vref1 to Vref2, or vise versa. Depending upon the rise or fall time of the voltage signal at terminal 60, there is a short period when both transistors 62a and 64b are simultaneously turned on. The situation can be more easily understood with reference to FIG. 3, which shows the voltage and current waveforms at various terminals of DAC 30 superimposed on a common time axis. Waveform 72 represents the voltage level at terminal 60 as it ramps up from Vref2 to Vref1 within time period tr. Waveform 74 shows the voltage level at internal node 70a inside CMOS switch 15a. During an initial time period ending at time t1, p-channel transistor 62a is turned on and n-channel transistor 64a is turned off. However, at time t1, when the voltage at terminal 60 equals the threshold voltage Vthn of n-channel transistor 64a, a further rise in voltage at terminal 60 turns n-channel transistor 64a fully on. P-channel transistor 62a does not turn off until a later time t2, the time when voltage level at terminal 60 surpasses the negative threshold voltage Vthp of transistor 68a. Phrased differently, during the time period td between t1 and t2, transistors 62a and 64d are both turned on with low impedance conductive channels that draw a large amount of current between terminals 16 and 18. Reference voltage supplies (not shown) that would normally be used for Vref1 and Vref2 are typically designed with a predetermined current limit. The current drawn when transistors 62a and 64a are both on exceed this imposed current limit, resulting in an unpredictable output voltage form the reference voltage supply. To aggravate the matter further, a long period of time is required for the output voltage level to recover its original steady state value. As a consequence, the DAC output signal at terminal 20 may be distorted, and in some cases it can even be an erroneous output.

With ever increasing demands for faster electronics, the channel lengths of CMOS transistors are designed with shorter and shorter dimensions by integrated circuit manufacturers. The result is a much lower channel impedance. During the time td, higher and more unpredictable current is pumped out of the reference voltage supply. The sudden surge of current between reference voltage terminals 16 and 18 is illustrated as waveform 76 in FIG. 3.

To alleviate these problems, DACs have been designed in the past with extra circuitry for the prevention of excessive switching currents. A common solution is to insert a break-before-make circuit between the digital input terminal and the DAC switch. A schematic of such a circuit is shown in FIG. 4. The break-before-make circuits are designated by reference numerals 17a–17d. The logical symbols of the break-before-make circuit are represented in 17b–17c, while its circuit implementation is illustrated in 17d. With the break-before-make circuits 17a–17d in place, the p-channel transistors 62a to 62d and the n-channel transistors 64a to 64d are prevented from turning on simultaneously.

Each break-before-make circuit includes cross-coupled NAND gates, such as gates 82d and 84d in break-before-make circuit 17d, which constitute a bi-stable circuit capable of storing digital information. For ease of understanding, the circuits associated with the MSB will be discussed. In this instance, the break-before-make circuit 17a is connected to the MSB circuitry. Included in break-before-make circuit 17a are NAND gates 82a and 84a. Suppose NAND gate 82a initially stores a digital bit "1" and further suppose that the positive logic convention is adopted in this case. Node 90a at the output of gate 82a is then at a high voltage level corresponding to a logic "1", while node 92a at the output of gate 84a is at a low voltage level corresponding to a logic "0". Inside the DAC's MSB switching circuit 95a, transistor 62a is a n-channel transistor and is turned off, while transistor 64a is also a n-channel transistor but is turned on.

Suppose the voltage at digital input node 60 needs to be switched to a high voltage value for the purpose of toggling switching circuit 95a. A low-to-high signal is then applied at digital input terminal 60. The change of voltage is shown as waveform 94 in FIG. 5. After passing through a signal inverting circuit 86a, the waveform is converted to a high-to-low signal with a time lag of td1 due to the propagation delay passing through signal inverting circuit 86a. Waveform 96 represents the signal at node 61, which is located at the output of signal inverting circuit 86a as shown in FIG. 5. The signal at node 61 then travels to NAND gate 82a. Since the other input to NAND gate 82a is at a logic "0" level (coupled from the low output of NAND gate 84a), NAND gate 82a responds by switching its output from a low to a high level. The change of signal at output node 90a is shown as waveform 98 in FIG. 5. Notice that waveform 98 lags behind waveform 96 by a time lag td2 due to the propagational delay of the electrical signal passing through NAND gate 82a. Similarly, the electrical signal at node 90a is connected to an input to NAND gate 84a. The other input to NAND gate 84a is at a logic level "1" at this time because it is tied to digital input terminal 60, and assumes the same waveform 94. NAND gate 84a reacts by switching its output from a high level to a low level; the result is shown in FIG. 5 as waveform 100 with a time lag td3 with respect to waveform 98. Switching circuit 95a reacts by toggling transistor 62a on and transistor 62f off. During a blanking period tb both transistor are off. Blanking period tb is the time period in which break-before-make circuit 17a ensures that transistor 62a is fully turned off before transistor 62b is allowed to be turned on. There is never an overlap when both transistors are turned on, so that sudden surges in current demand and disruption in the operation of the reference voltage supply are avoided.

The addition of the break-before-make circuits significantly increases the complexity and cost of the DAC. More importantly, speed performance is also penalized. The summation of the time lags td1, td2 and td3 as shown in FIG. 5 adds an extra delay to the digital-to-analog conversion process. Consequently, circuits of this type have limited applications in high frequency operations.

SUMMARY OF THE INVENTION

It is the main objective of the present invention to economically provide a digital-to-analog converter with a significant reduction in output distortion and yet without any speed or performance degradations. Simplicity in design and compactness in layout space is also sought.

In the first embodiment of the invention, the DAC comprises a plurality of circuit stages. In each of the circuit stages, two n-channel transistors are utilized as the basis for the switching circuit. A signal inverting circuit is electrically disposed between the gates of the two n-channel transistors for the proper signal control. The switching circuit drives the resistor network through a switch output node. The first n-channel transistor has a first resistor electrically connected to it, and constitutes an assertive circuit portion which is electrically connected between a first reference voltage supply conductor and the switch output node. In a similar manner, the second n-channel transistor has a second resistor electrically connected to it, and constitutes a complementary circuit portion which is electrically connected between a second reference voltage supply conductor and the switch output node. The first and second resistors, and the resistors in the resistor network, are substantially equal in ohmic values. Thus, when one of the circuit portions is active and the other is inactive, the corresponding resistor in the active circuit portion operates as a part of the resistor network to perform the duty of voltage dividing between the first and second reference voltage supply conductors. However, when both of the circuit portions are active, the first and second resistors operate together as a current limiting circuit to prevent the excessive current surge between the first and second reference voltage supply conductors.

In a second embodiment of the present invention, a p-channel and a n-channel transistor are utilized as the switching circuit. The p-channel and the n-channel devices respond in a complementary fashion and the signal inverting circuit used in the first embodiment is therefore not needed. The rest of the circuit structure is substantially the same as the first embodiment.

In a third embodiment, the assertive circuit portion in the switching circuit comprises a p-channel transistor, a n-channel transistor, and a first resistor. The complementary circuit portion in the switching circuit comprises a n-channel transistor and a second resistor. The structure and the principle of design of this embodiment are similar to the previous two embodiments. Because of the extra transistor in the assertive circuit portion, the DAC of the third embodiment can accommodate a wide range of reference voltages to suit different applications.

These and other features and advantages of the invention will be apparent to those skilled in the art from the following detailed description, taken together with the accompanying drawings, in which like reference numerals refer to like parts.

DESCRIPTION OF THE DRAWINGS

FIG. 9 is a plan view showing the layout of one of the circuit stages of the digital-to-analog converter shown in FIG. 8.

DETAILED DESCRIPTION OF THE INVENTION

Figure 1:
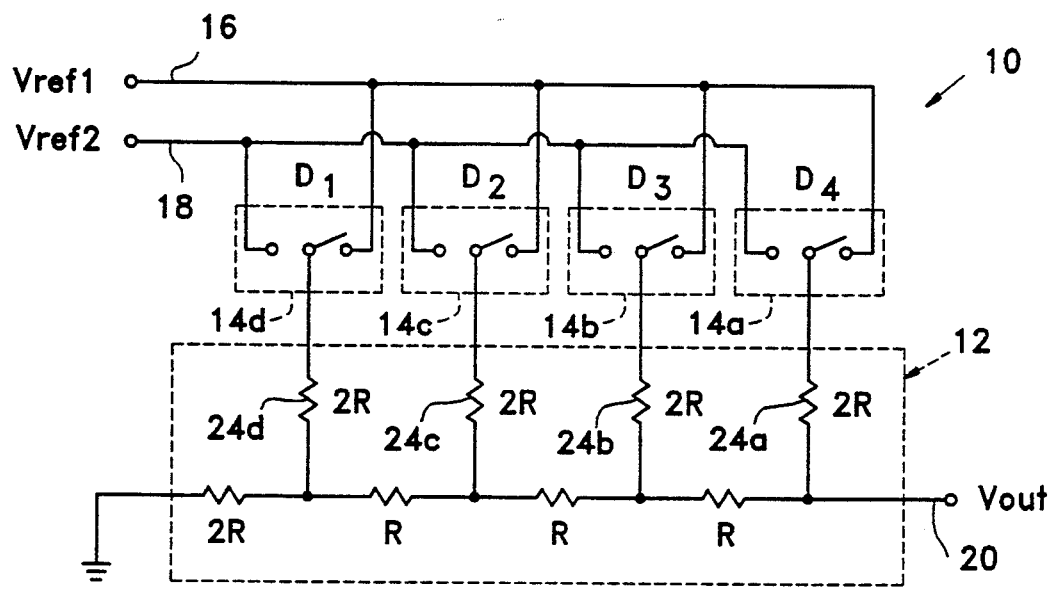
FIG. 1, as described above, is a schematic drawing showing a digital-to-analog circuit in general.
Figure 2:
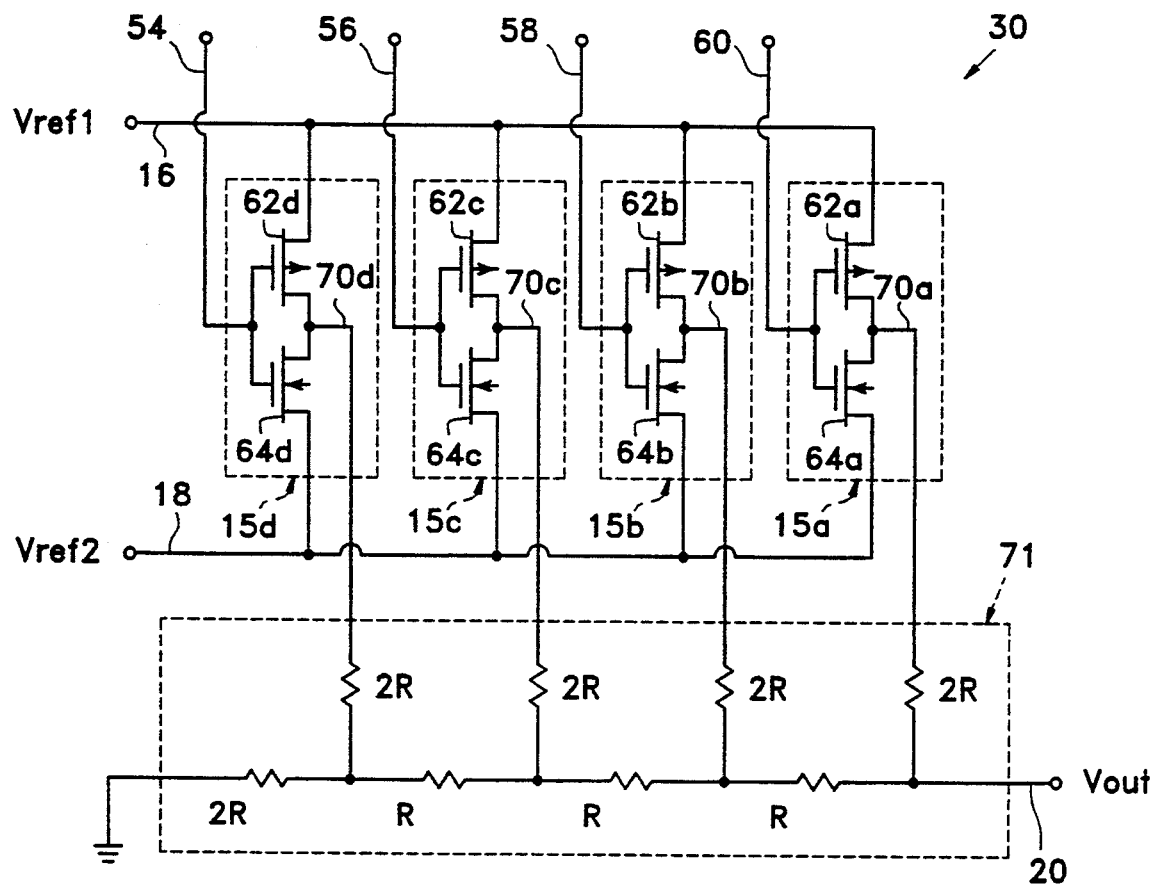
FIG. 2, as described above, is a schematic drawing of a prior art implementation of the digital-to-analog circuit shown in FIG. 1.
Figure 3:
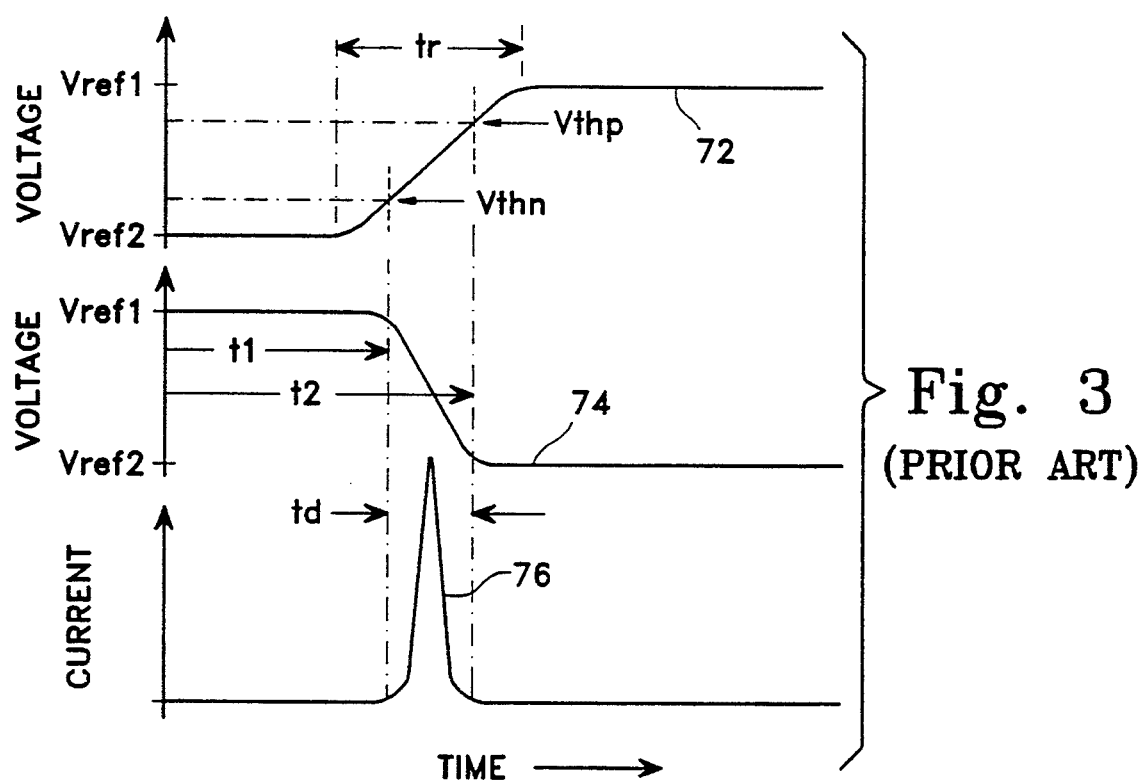
FIG. 3, as described above, is a timing diagram of waveforms showing the electrical responses of the digital-to-analog circuit of FIG. 2.
Figure 5:
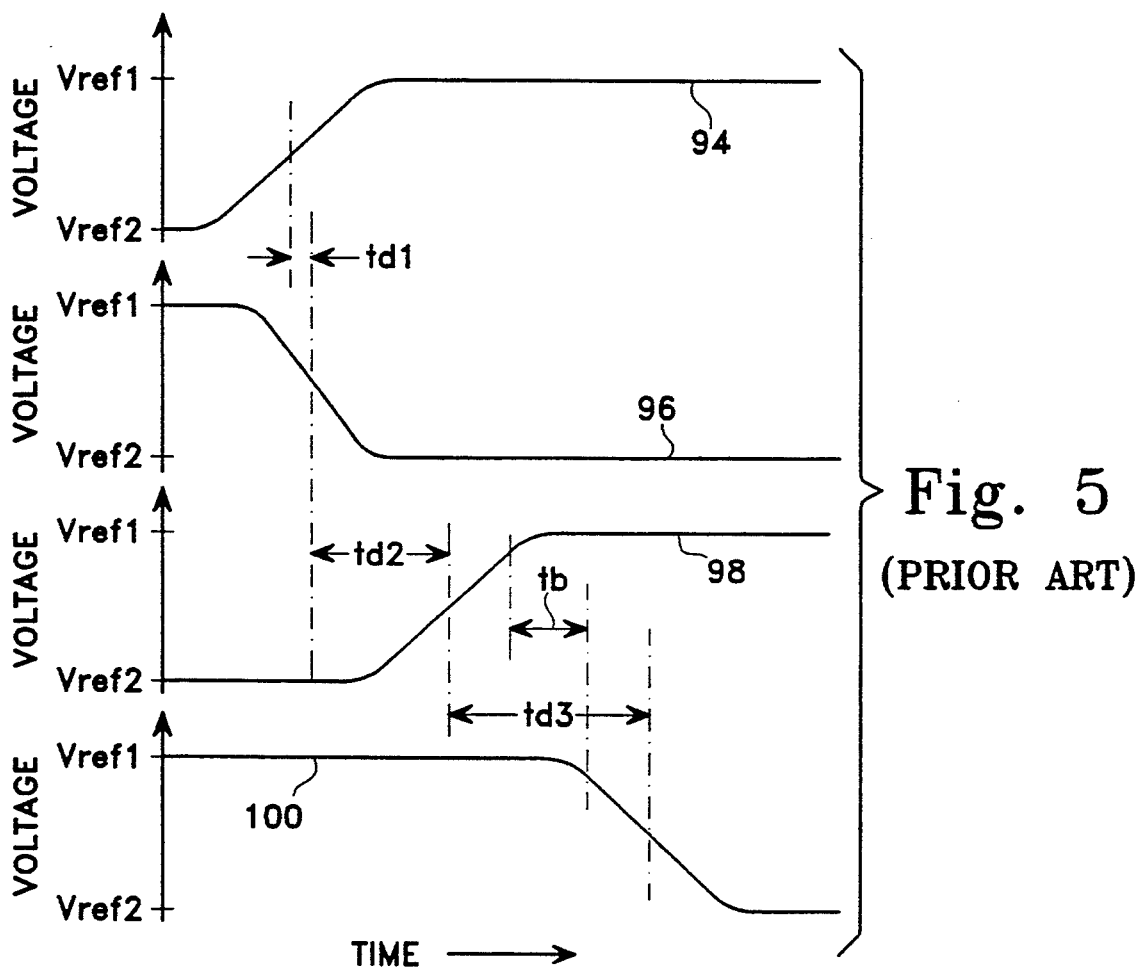
FIG. 5, as described above, is a timing diagram of waveforms showing the electrical responses of the digital-to-analog circuit of FIG. 4.
Figure 4:
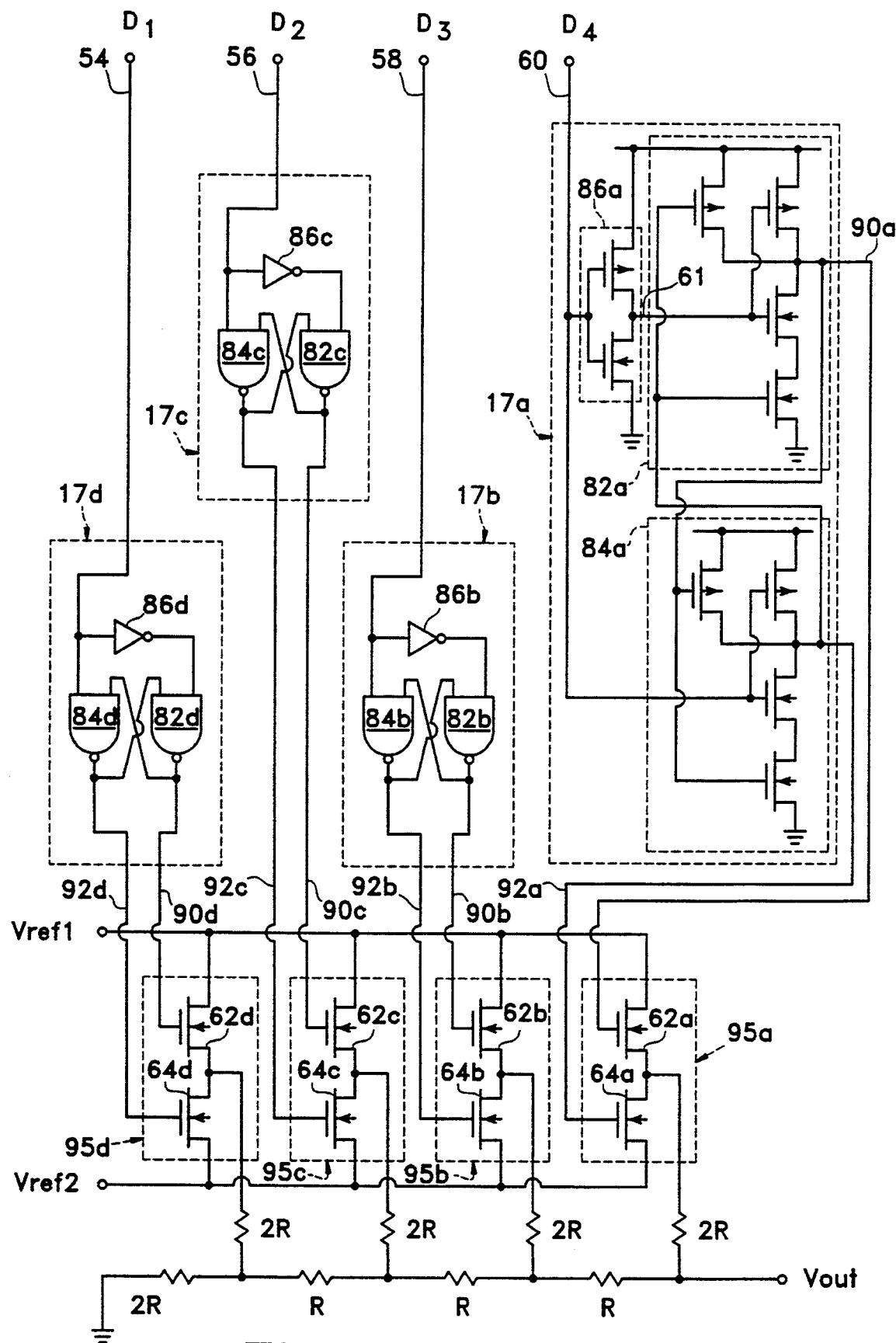
FIG. 4, as described above, is a schematic drawing of another prior art implementation of the digital-to-analog circuit shown in FIG. 1.
Figure 6:
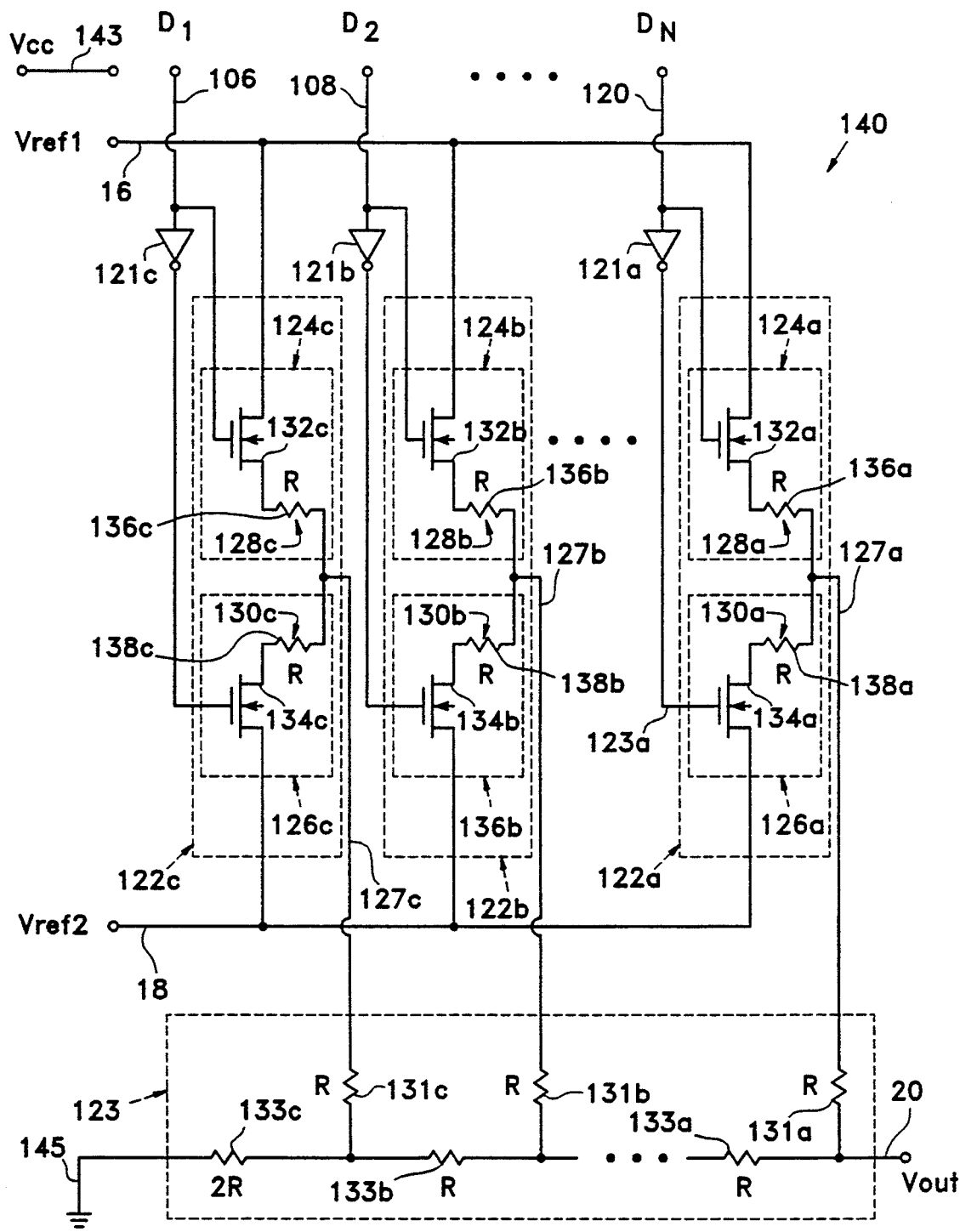
FIG. 6 is a schematic drawing showing a first embodiment of the present invention.

Reference is now made to FIG. 6, which shows the first embodiment of the present invention. The DAC of this embodiment, generally denoted by reference numeral 140, comprises n circuit stages. For the sake of clarity, only three stages are shown in the drawing. DAC 140 includes n digital input terminals, three of which are shown as terminals 106, 108 and 120. Terminals 120 and 106 are assigned to accept the MSB $D_N$ and the LSB $D_1$, respectively. Digital data are fed into signal inverting circuits 121a to 121c before entering the plurality of switching circuits 122a to 122c. In this embodiment, a first power supply conductor 143 supplies the overall power for the DAC circuit 140, while a second power supply conductor 145 is also provided for the ground return. Again, for ease of illustration and understanding, only the circuit stage corresponding to the MSB is discussed. It should be appreciated that the operation and structure of the other stages are substantially similar.

Switching circuit 122a comprises an assertive circuit portion 124a and a complementary circuit portion 126a. It here should be noted that the use of the terms "assertive" and "complementary" is relative. In this specification and in the appended claims, a circuit portion of a DAC is called "assertive" when the logical level at the output of the DAC generated by the circuit portion assumes the same logical level as the input applied to the DAC. Conversely, a circuit portion of a DAC is called "complementary" when the logical level at the output of the DAC generated by the circuit portion assumes the opposite logical level as the input applied to the DAC. For example, in a system which adopts the positive logic convention, in which the logic "1" is assigned a true value and an logic "0" is assigned a false value, an "assertive" circuit portion of a DAC is a circuit portion that would generate a logic "1" at the corresponding output of the DAC when a logic "1" is applied to the corresponding input of the DAC. Similarly, a "complementary" circuit portion generates a logic "0" at the corresponding output of the DAC when a logic "1" is applied to the corresponding input of the DAC. Returning now to FIG. 6, included within assertive circuit portion 124a is a first dissipative circuit 128a. Similarly, complementary circuit portion 126a is included a second dissipative circuit 130a. The inclusion of dissipative circuits 128a and 130a in assertive circuit portion 124a and complementary circuit portion 126a, respectively, serves a very special function which will be explained later.

Assertive circuit portions 124a is electrically connected between the first reference voltage supply terminal 16 and a switch output node 127a. In a similar manner, complementary circuit portion 126a is electrically connected between the second reference voltage supply terminal 18 and switch output nodes 127a. Switch output nodes 127a to 127c are electrically connected to the respective weighing resistors 131a to 131c, respectively, of the resistor network 123 as shown in FIG. 6. Resistor network 123 provides the accumulated stepped-analog signal Vout at the output voltage terminal 20. Optionally, first and second reference voltage supply terminals 16 and 18 can be electrically connected to first and second power supply conductors 143 and 145, respectively. If this is the case, the number of voltage supply terminals can be reduced and the analog output signal would sweep within the Vcc and ground level.

The operational details of the switching circuits 122a to 122c is herein described. Again, for the ease of understanding, attention is directed only to switching circuit 122a. In this embodiment, assertive circuit 124a includes a first n-channel transistor 132a, while complementary circuit portion 126c comprises a second n-channel transistor 134a. The gate input of transistor 132a is electrically tied to digital input terminal 120, while the gate input of transistor 134a is electrically connected to the node 123a which is the output of inverting circuit 121a. Moreover, in this embodiment first and second dissipative circuits 128a and 130a comprises ohmic resistors 136a and 138a, respectively.

Suppose the voltage at input terminal 120 is initially at a low level. In this embodiment, the low voltage level is chosen to be a level close to Vref2. Transistor 132a is off, since its gate threshold has not yet exceeded. Inverting circuit 121a inverts the low voltage at Vref1 terminal 16, so that a high voltage appears at node 123a. In this embodiment, the high voltage level is selected to be a level close to the first reference voltage level Vref1. As a consequence, transistor 134a is turned on. The channel of the off transistor 132a assumes a very high impedance, which in essence electrically isolates switch output node 127a from reference voltage terminal 16. At the same time, the on channel of active transistor 134a and resistor 138a electrically connect switch output node 127a to reference Vref2 voltage terminal 18. Current therefore flows from reference voltage terminal 18 to resistor network 123.

It should here be emphasized that resistor 138a functions as a part of the DAC resistor network 123 to perform the duty of dividing the voltage between reference voltages Vref1 and Vref2. The divided voltage is then accumulated on a branch resistor such as resistor 133a as part of the stepped analog voltage at output terminal 20. In prior DACs employing R-2R resistor networks, weighing resistor 131a in resistor network 123 has an ohmic value twice that of the branch resistors such as resistor 133a. However, in this embodiment, half of the resistive value of weighing resistor 131a is incorporated into dissipative circuit 130a, so that resistors 130a and 131a have the same resistance R. The result is that there is no loss of voltage dividing capability of DAC 140 in its entirety, as current from terminal 18 still travels through resistors 130a and 131a which have a combined resistive value twice that of the branch resistors such as 133a. Similarly, when the voltage level at terminal 120 is at a high level, transistor 132a is turned on while transistor 134a is turned off. Current flows from reference voltage supply terminal 16 to the resistor network 123 via the on channel of transistor 132a, resistor 128a and switch output node 127a. Resistor 136a operates as a part of resistor network 123 for voltage division. Again, resistors 131a and 136a each has a resistance R so that their combined resistive value is twice that of the branch resistors such as resistor 133a, without compromising the voltage dividing capability.

Attention is now directed to the situation when the voltage level at input terminal switches from one state to another. During the switching transition, there is a brief period of time when both transistors 132a and 134a are temporary turned on, as described previously. With many prior art DACs, a sudden surge of current is demanded from the reference voltage supply terminals 16 and 18, which are in turn tied to a reference voltage supply circuit (not shown). This surge of current most likely exceeds the imposed current limit of the reference voltage supply circuit since the on channel resistance of both transistors is less than an ohm, while the output of the reference supply is in the order of several volts. The result is unpredictable, depending upon the design of the reference supply circuit. Vref1 and Vref2 can drift to unstable voltage levels and require a long period of time before slowly oscillating back to their original intended levels. The drifting of voltage levels at the reference voltage supply terminals is directly reflected into the resistor network, which in turn may produce an erroneous output analog signal.

In the switching circuit 122a of the present invention, resistors 128a and 130a directly limit the current from reference voltage supply terminals 16 to 18 in the event both transistors 132a and 134a are on. In effect, resistors 136a and 138a operate together as a current limiting circuit to cover the unstable transitional switching period. In practice, resistors 136a and 138 are in the range of kilo-ohms. Therefore, the worst cases current are on the order of a fraction of a milli-amp, which is well within the current limit of most reference voltage supplies. Thus, the inclusion of a part of weighing resistors 131a to 131c in switching circuits 122a and 122c as described economically solves the analog signal distortion problem. Moreover, there is no substantial increase in die space if the DAC is integrated in a semiconductor substrate. Most important of all, there is no sacrifice in the DAC's performance.

Figure 7:
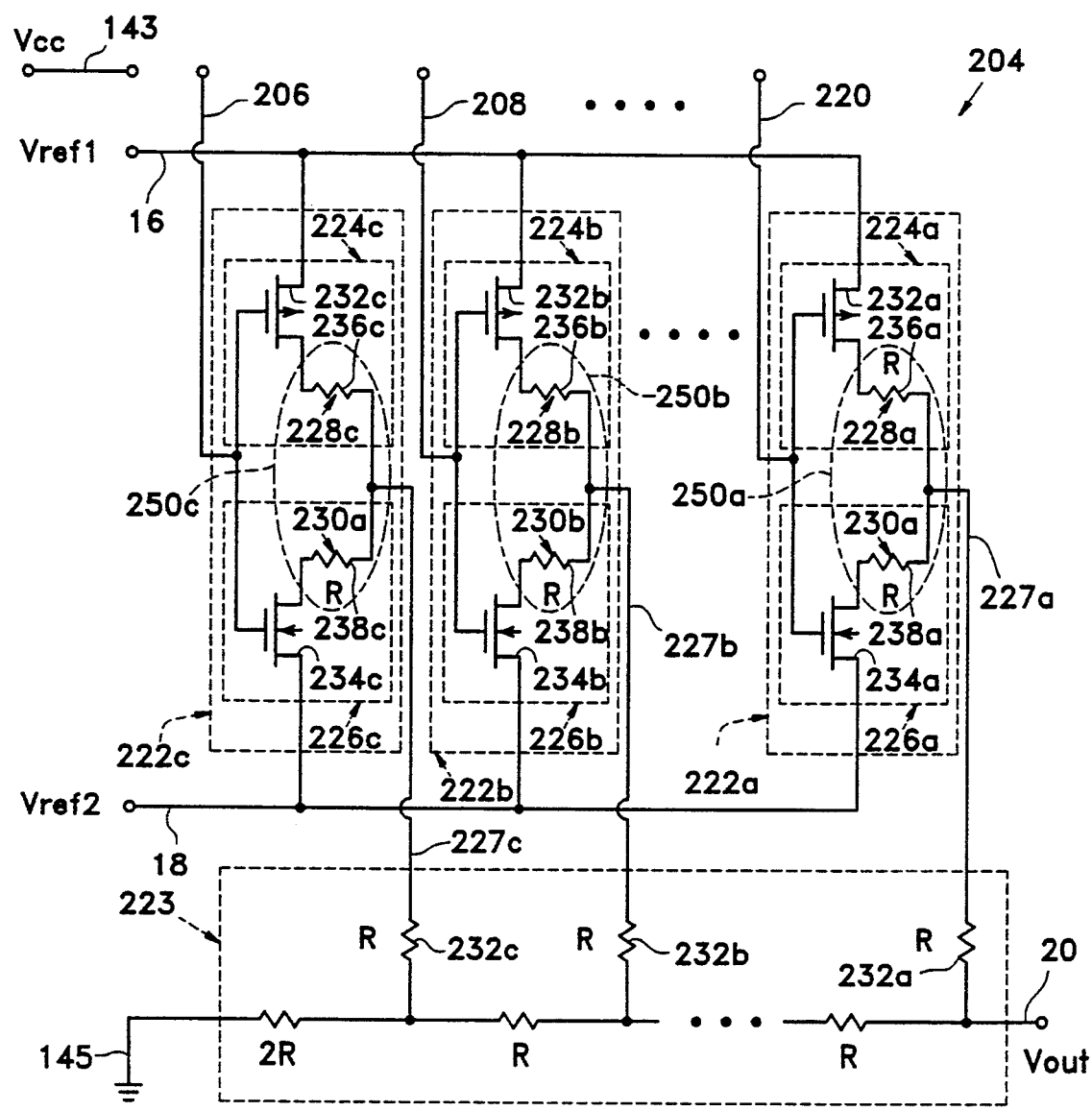
FIG. 7 is a schematic drawing showing a second embodiment of the present invention.

FIG. 7 shows a second embodiment of the present invention. The DAC in this embodiment is generally denoted by reference numeral 204. There are quite a number of similarities between this embodiment and the previous embodiment. For a concise and clear illustration, only the differences are elaborated. As with the description with the previous embodiment, only one circuit stage is illustrated. Switching circuit 222a comprises an assertive circuit portion 224a and a complementary circuit portion 226a. Assertive circuit portion 224a includes a p-channel transistor 232a and a first dissipative circuit 228a. In a similar fashion, complementary circuit 226a comprises a n-channel transistor 234a and a second dissipative circuit 230a. In this embodiment, first and second dissipative circuits 228a and 230a are ohmic resistors 236a and 238a, respectively.

There is a difference between this embodiment and the previous embodiment. The inverting circuits 121a–121c before the gate terminals of transistors 232a and 234a in FIG. 6 are not present in FIG. 7. This is because transistors 232a and 234a have threshold voltages of different polarities. Specifically, transistor 234a has a positive threshold voltage while transistor 232a has a negative threshold voltage. When the voltage at terminal 220 is at high, for example at Vref1, transistor 234a is turned on while transistor 232a is off. Switch output node 227a is electrically connected to terminal 18 via the on channel of active transistor 234a and resistor 238a. Switch output node 227a is substantially electrically isolated from terminal 16 due to the high impedance of the off channel of inactive transistor 232a. In a similar manner, when the voltage at terminal 220 is at a low level, for example at Vref2, p-channel transistor 232a is on while n-channel transistor 234a is off. This time, switch output node 227a is electrically connected to terminal 16 and isolated from terminal 18.

As with the previous embodiment, during the transitional switching periods when both transistors 232a and 234a are temporarily turned on, dissipative circuits 228a and 230a serve as a current limiting circuit 250a for the suppression of excessive current surges. With this feature, the analog output can be glitch free and maintains its error-free level. Similarly, as an option, second reference voltage supply conductor 18 can be electrically connected to second power supply conductor 145, which is tied to the ground level in this case. As a further option, the first reference voltage supply conductor 16 can be electrically connected to first power supply conductor 143 rather than Vref1.

Figure 8:
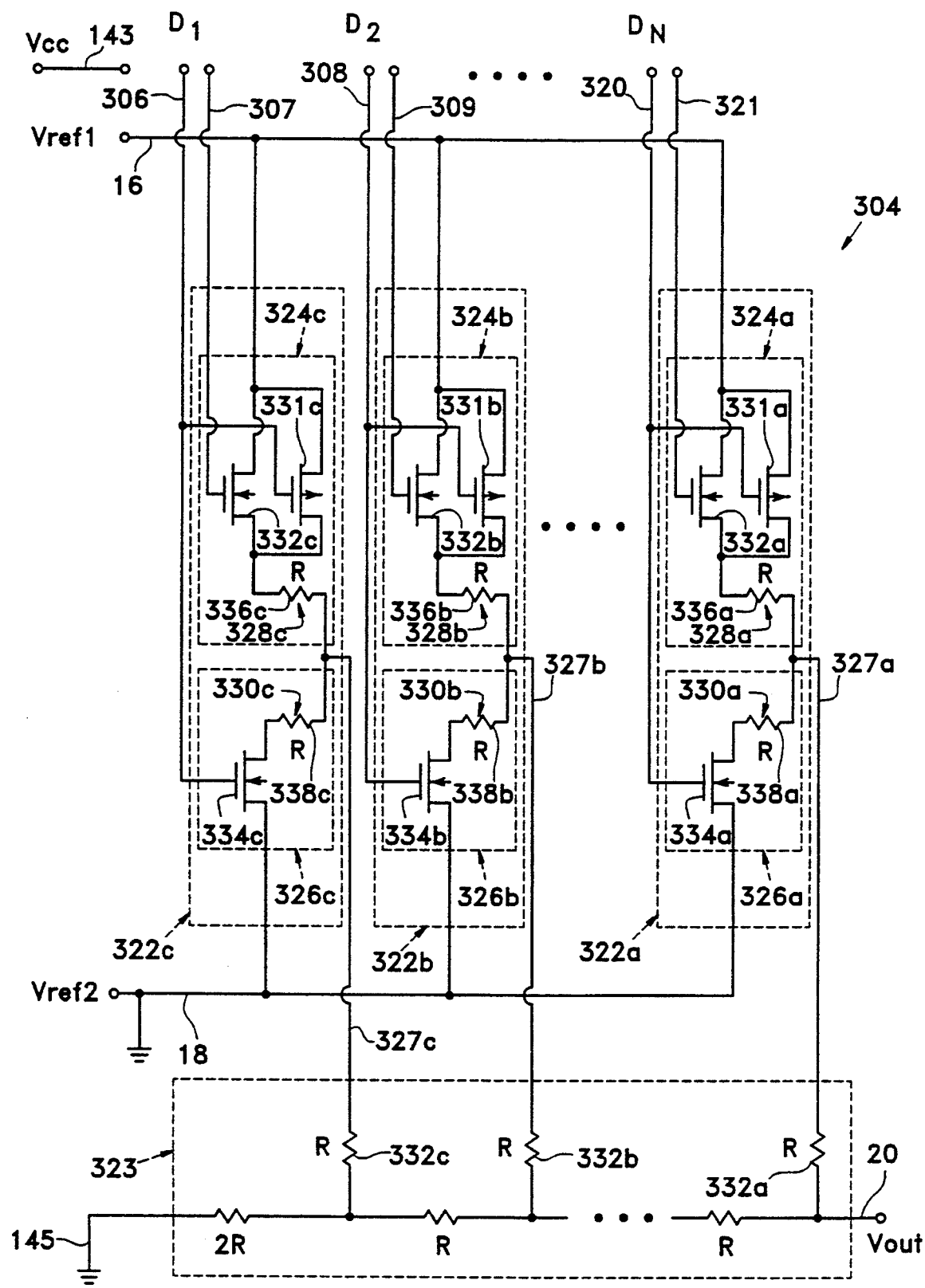
FIG. 8 is a schematic drawing showing a third embodiment of the present invention.

FIG. 8 shows a third embodiment of the invention. The DAC of this embodiment is designated by reference numeral 304. Again, there are a number of similarities between this embodiment and the previous embodiments, and only the differences are highlighted.

The circuit comprises of n substantially identical circuit stages. Three of the circuit stages are shown in FIG. 8. As with the previous cases, only the stage related to the MSB will be discussed. Switching circuit 322a includes an assertive circuit portion 324a and a complementary circuit portion 326a. In this embodiment, assertive circuit portion 324a includes a p-channel transistor 331a connected in parallel with a n-channel transistor 332a. A first dissipative circuit 328a is also attached to the source terminal of n-channel transistor 332a. The complementary circuit portion 326a includes another n-channel transistor 334a in series with a second dissipative circuit 330a. First and second dissipative circuits 328a and 330a in this embodiment are ohmic resistors 336a and 338a, respectively. One of the end terminals of each of the resistors 336a and 338a are electrically tied together and connected to a switch output node 327a.

Two digital input terminals 320 and 321 are provided for each digital datum. Terminal 320 receives the true value of the datum, while terminal 321 receives the complementary value. The unique arrangement of the transistors in this embodiment accommodates a wide range of reference voltages to fit different applications. For example, if the reference voltage is always positive, n-channel transistor 332a may not be needed as its activity is masked by p-channel transistor 331a. If the reference voltage range is from a positive level to a negative level, all three transistors 331a, 332a and 334a will be engaged in operation. As with the previous embodiments, dissipative circuits 328a and 330a function as part of resistor network 323 for the duty of voltage dividing between Vref1 and Vref2, when either assertive circuit 324a and 326a, but not both, is active. However, when both the assertive circuit portion 324a and the complementary circuit portion 326a are active, dissipative circuits 338a and 330a function as a current limiting circuit to prevent a large current surge between terminals 16 and 18.

FIG. 9 is a plan view showing the physical layout of the embodiment shown in FIG. 8 on a semiconductor substrate 400. The interconnected devices as shown correspond to the switching circuit 322a in FIG. 8. Assertive circuit portion 324a comprises p-channel transistor 331a, n-channel transistor 332a, and first dissipative circuit 328a. Complementary circuit portion 326b includes n-channel transistor 334a and second dissipative circuit 330a. First and second dissipative circuits 328a and 330a in this embodiment comprise ohmic resistors 336a and 338a, respectively. It should be noted that resistors 336a and 338a, along with weighing resistor 332a and other resistors such as resistor 402 belonging to the resistor network 323, are disposed on the semiconductor substrate substantially in the same orientation and adjacent to each other. The absolute ohmic value of a resistor in a semiconductor substrate is difficult to control due to factors such as semiconductor crystal orientation, localized crystal defects, mask misalignment, and uneven doping concentration within a wafer during the fabrication process. However, with the embodiments of the present invention which rely on the ratios of the resistor values, in conjunction with the aforementioned arrangement, analog signals with a high degree of precision can be obtained from the output terminal 20.

Finally, other changes are possible within the scope of the invention. For example, the transistors used need not be MOS transistors. Other devices can be used as substitutes with minor modifications to the overall schematic. For example, bipolar or other Field Effect Transistors (FETs) can take the place of MOS transistors in the above embodiments.

In addition, within a switching circuit the resistive values of each of the dissipative circuits need not be the same as the resistive value of the weighing resistors. The resistive values of each of the dissipative circuits can be different, without compromising the circuit voltage dividing capability.

Furthermore, the dissipative circuits can be positioned differently than described. For example, in FIG. 8 the first dissipative circuit 336a can be inserted between first reference voltage supply terminal 16 and n-channel transistor 332a in the assertive circuit, and the second dissipative circuit 330a can be disposed close to the source terminal of transistor 334a instead of the drain terminal.

While the present invention has been shown and described with reference to preferred embodiments, it will be understood by those skilled in the art that these and other changes in form and detail may be made without departing from the scope and spirit of the invention as defined by the appended claims.

What is claimed is:

1. A digital-to-analog converter for converting digital signals to stepped-analog signals, comprising:
   first and second reference voltage supply conductors;
   a switching circuit output node;
   a resistor network electrically connected to said switching circuit output node, said resistor network generally proportionally dividing the voltage between the first and second reference voltage supply conductors; and
   a switching circuit that is activated in response to the digital signals, said switching circuit including as assertive circuit portion having a first dissipative circuit electrically connected thereto, and a complementary circuit portion having a second dissipative circuit electrically connected thereto, said assertive and complementary circuit portions being electrically connected to said switching circuit output node such that, when either one of said circuit portions is active and the other circuit portion is inactive, the dissipative circuit in the active circuit portion operates as a part of said resistor network for the proportional dividing of voltage between the first and second reference voltage supply conductors, thereby providing the divided voltage as part of the stepped analog signals, and such that when both circuit portions are active, both dissipative circuits operatively function together for the limiting of current between said first and second reference voltage supply conductors, thereby preventing current surges between the reference voltage supply conductors.

2. The digital-to-analog converter as set forth in claim 1 wherein said assertive circuit portion comprises a p-channel transistor.

3. The digital-to-analog converter as set forth in claim 1 wherein said complementary circuit portion comprises an n-channel transistor.

4. The digital-to-analog converter as set forth in claim 3 wherein said assertive circuit portion comprises an n-channel transistor.

5. The digital-to analog converter as set forth in claim 3 wherein said assertive circuit portion comprises a p-channel and a n-channel transistor.

6. The digital-to-analog converter as set forth In claim 1 wherein said first and second dissipative circuits are ohmic resistors.

7. The digital-to-analog converter as set forth in claim 1 wherein said converter is formed in a semiconductor substrate.

8. The digital-to-analog converter as set forth in claim 7 wherein said resistive network comprises a plurality of ohmic resistors, and wherein the ohmic resistors of said resistive network and said dissipative circuits are disposed in the semiconductor substrate substantially in the same orientation and adjacent to each other.

9. The digital-to-analog converter as set forth in claim 1 further comprising a first and a second power supply conductor and with said second reference voltage supply conductor being electrically connected to said second power supply conductor.

10. The digital-to-analog converter as set forth in claim 9 wherein the first reference voltage supply conductor is electrically connected to the said first power supply conductor.

11. A digital-to-analog converter for converting digital signals to stepped-analog signals having first and second reference voltage supply conductors, said digital-to-analog converter including a plurality of circuit stages, each of said circuit stage comprising:
   a switching circuit output node;
   a weighing resistor having a first end and a second end, said first end of said weighing resistor being electrically connected to said switching circuit output node; and a switching circuit including an assertive circuit portion having a first dissipative circuit electrically connected thereto, and a complementary circuit portion having a second dissipative circuit electrically connected thereto, said assertive circuit portion being electrically connected between said first reference voltage supply connector and said switching circuit output node, and said complementary circuit portion being electrically connected between said second reference voltage supply conductor and said switching circuit output node;

wherein said digital-to-analog converter further including a plurality of branch resistors, each of the second ends of said weighing resistors being electrically connected together through one of said branch resistors, said weighing and branch resistors constituting a resistor network which generally proportionally divides the voltage between the first and second reference voltage supply conductors, each of said switching circuits being activated in response to the digital signals such that, when either one of each of said circuit portions is active, the dissipative circuit in the active circuit portion operates as a part of said resistor network for the proportional dividing of voltage between the first and second reference voltage supply conductors, thereby providing the divided voltage as part of the stepped analog signals, and such that when both circuit portions are active, both dissipative circuits operatively function together for the limiting of current between said first and second reference voltage supply conductors, thereby preventing current surges between the reference voltage supply conductors.

12. The digital-to-analog converter as set forth in claim 11 wherein each of said assertive circuit portions comprises a p-channel MOS transistor, and wherein each of said complementary circuit portions comprises a n-channel transistor.

13. The digital-to-analog converter as set forth in claim 11 wherein each of said assertive circuit portions comprises a first n-channel MOS transistor, and wherein each of said complementary circuit portions comprises a second n-channel MOS transistor.

14. The digital-to-analog converter as set forth in claim 13 wherein each of said first and second n-channel MOS transistors further including a gate terminal, and wherein said digital-to-analog converter further comprising a plurality of signal inverting circuits, with each of said signal inverting circuit being electrically disposed between said gate terminals of said first and second n-channel transistors.

15. The digital-to-analog converter as set forth in claim 11 wherein each of said assertive circuit portions comprises a p-channel MOS transistor and a first n-channel MOS transistor, and wherein each of said complementary circuit portions comprises a second n-channel MOS transistor.

16. The digital-to-analog converter as set forth in claim 11 further comprising a first and a second power supply conductor and with said second reference voltage supply conductor being electrically connected to said second power supply conductor.

17. The digital-to-analog converter as set forth in claim 16 wherein said first reference voltage supply conductor is electrically connected to said first power supply conductor.

18. A digital-to-analog converter for converting digital signals to stepped-analog signals, comprising:
first and second reference voltage supply conductors;
a switching circuit output node;
a resistor network electrically disposed between said switching circuit output node and a power supply conductor, said resistor network generally proportionally dividing the voltage between the first and second reference voltage supply conductors;
a switching circuit that is activated in response to the digital signals, said switching circuit including a first transistor having a first resistor electrically connected thereto, said first transistor being electrically connected to the first reference voltage supply connector and said first resistor being electrically connected to said switching circuit output node, said switching circuit further comprising a second transistor having a second resistor electrically connected thereto, said second transistor being electrically connected to the second reference voltage supply connector and said second resistor being electrically connected to said switching circuit output node such that, when either one of said transistors is active and the other transistor is inactive, the resistor which is electrically connected to the active transistor operates as a part of said resistor network for the proportional dividing of voltage between the first and second reference voltage supply conductors, thereby providing the divided voltage as part of said stepped analog signals, and such that when both transistors are active, both resistors function together for the limiting of current between said first and second reference voltage supply conductors, thereby preventing current surges between the reference voltage supply conductors.

19. The digital-to-analog converter as set forth in claim 18 wherein said first and second resistors are substantially equal in ohmic values.

20. The digital-to-analog converter as set forth in claim 18 wherein said first and second transistors are n-channel MOS transistors.

21. The digital-to-analog converter as set forth in claim 20 further comprising a p-channel MOS transistor electrically connected between said first reference voltage supply conductor and said first resistor.

22. The digital-to-analog converter as set forth in claim 18 wherein said first transistor is a p-channel MOS transistor and wherein said second transistor is a n-channel MOS transistor.

23. The digital-to-analog converter as set forth in claim 18 further comprising a first and a second power supply conductor and with said second reference voltage supply conductor being electrically connected to the second power supply conductor.

24. The digital-to-analog converter as set forth in claim 23 wherein said first reference voltage supply conductor is electrically connected to the first power supply conductor.

* * * * *